(12) United States Patent
Gehlot

(10) Patent No.: US 6,404,819 B1
(45) Date of Patent: *Jun. 11, 2002

(54) SYSTEM AND METHOD FOR GENERATING NRZ SIGNALS FROM RZ SIGNALS IN COMMUNICATIONS NETWORKS

(75) Inventor: Narayan L. Gehlot, Sayerville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/197,223

(22) Filed: Nov. 20, 1998

(51) Int. Cl.⁷ .............................................. H04B 14/04
(52) U.S. Cl. ........................................ 375/242; 341/69
(58) Field of Search ................ 375/242, 241, 375/254, 259; 332/106; 341/68, 69, 72; 359/184

(56) References Cited

U.S. PATENT DOCUMENTS

| | | | | |
|---|---|---|---|---|
| 4,455,662 A | * | 6/1984 | Gutleber | 375/242 |
| 5,107,263 A | * | 4/1992 | Kim et al. | 341/73 |
| 5,610,606 A | * | 3/1997 | Fukunaga et al. | 341/143 |
| 6,198,559 B1 | * | 3/2001 | Gehlot | 359/161 |
| 6,263,465 B1 | * | 7/2001 | Gehlot | 714/746 |

\* cited by examiner

Primary Examiner—Chi Pham
Assistant Examiner—Phuong Phu
(74) Attorney, Agent, or Firm—Law Offices of John Ligon

(57) ABSTRACT

An invention for use in electrical or optical communications for generating UNRZ data from URZ data is disclosed. The method of the invention transmits URZ data at the transmitter and receives UNRZ data at the receiver. The invention takes advantage of transmitting URZ data and eliminates the drawbacks of receiving URZ data. The invention also takes advantage of receiving UNRZ data and eliminates the drawbacks of transmitting UNRZ data. The net bandwidth requirement of a communications system implemented according to the method of the invention, with URZ and $URZ_d$ data transmitted via a transmission medium and converted to UNRZ coding at a receiver location, is the same as that of a system that transmits and receives UNRZ data.

14 Claims, 3 Drawing Sheets

TRANSMIT URZ AND URZ$_d$ ALTERNATE "1" AND "0"s AND RECEIVE UNRZ AS DATA

TRANSMIT URZ AND URZ$_d$ ALL "0"s AND RECEIVE UNRZ ALL "0"s AS DATA

TRANSMIT URZ AND URZ$_d$ "1" AND "0"s AND RECEIVE UNRZ AS DATA

TRANSMIT URZ AND URZ$_d$ ALL "1"s AND RECEIVE UNRZ ALL "1" AS DATA

SYSTEM AND METHOD FOR GENERATING NRZ SIGNALS FROM RZ SIGNALS IN COMMUNICATIONS NETWORKS

CROSS REFERENCE TO RELATED APPLICATIONS

This application is related to U.S. patent application Ser. No. 09/196,984, entitled "ERROR DETECTION AND CORRECTION IN SYSTEMS RECEIVING NRZ SIGNALS FROM TRANSMISSION OF RZ SIGNALS" (GEHLOT-11); U.S. patent application Ser. No. 09/197,071, entitled "AUTOMATIC DELAY COMPENSATION FOR GENERATING NRZ SIGNALS FROM RZ SIGNALS IN COMMUNICATIONS NETWORKS" (GEHLOT-9); U.S. patent application Ser. No. 09/197,154, entitled "SYSTEM AND METHOD FOR IMPROVED SIGNAL TO NOISE RATIO IN OPTICAL COMMUNICATIONS NETWORKS" (GEHLOT-10); U.S. patent application Ser. No. 09/197,390, entitled "SYSTEM AND METHOD FOR REDUCTION OF IMPACT FROM UNWANTED SIGNALS IN OPTICAL COMMUNICATIONS SYSTEMS" (GEHLOT-8); U.S. patent application Ser. No. 09/197,222, entitled "APPARATUS AND METHOD TO OVERCOME DISPERSION LIMITATIONS IN HIGH SPEED COMMUNICATIONS SYSTEMS AND NETWORKS" (GEHLOT-5); U.S. patent application Ser. No. 09/197,073, entitled "APPARATUS AND METHOD FOR REDUCING OPTICAL IMPAIRMENTS IN OPTICAL COMMUNICATIONS SYSTEMS AND NETWORKS" (GEHLOT-6); and U.S. patent application Ser. No. 09/197,403, entitled "APPARATUS AND METHOD FOR REDUCING PHASE MODULATED GAIN FLUCTUATIONS IN OPTICAL COMMUNICATIONS SYSTEMS AND NETWORKS" (GEHLOT-12); said related application being concurrently filed with the present application, all said related applications having the same inventor, and all being incorporated herein by reference.

FIELD OF INVENTION

The invention is in the field of signal coding and bandwidth management in communications. The invention can be used for coding data transmitted in any channel such as electrical, wireless, optical, cable, semiconductor waveguides, or free space media using any type of transmission channels.

BACKGROUND OF INVENTION

In the transmission of information across a communications channel, it is generally necessary to convert the user (or source) information to the form of a signal which is compatible with transmission characteristics of the communications channel. Such conversion is in many cases accomplished through modulation of an electrical or optical carrier signal by the information content itself—that electrical or optical signal being transmitted over the communications channel. In the case of information in digital form (hereafter generally referred to as "data"), the "1"s and "0"s representing the data are encoded into a form that can be used to drive, or modulate an aspect of the transmission carrier signal, such as amplitude, frequency, phase, or polarity. The complexity of the modulation method varies. More bandwidth and power are required for certain modulation methods.

Various modulation techniques for digital data are known in the art, but among the more useful methods is that of "line coding" the user data, where the line coded data becomes the baseband signal modulating the electrical or optical channel carrier. Typically, such line codes map the data value "1" to a high signal value defined by the coding format and the value "0" to a low signal value. While, these line coding formats can include negative (less than zero) signal values for the low signal state, such a negative low signal state cannot be realized for optical transmission systems—the concept of "negative" light not being realizable, at least in practice. Accordingly, as the use of optical transmission media has become increasingly the norm, "unipolar" line codes have been developed in which the low signal state is maintained at zero or a small non-zero optical signal level.

Two line coding methods of particular interest are designated "unipolar return-to-zero" (URZ) and "unipolar non-return-to-zero" (UNRZ) coding formats. URZ and UNRZ coding are types of pulse/no-pulse (or, on-off-keying) modulation coding formats well known in the communications arts and are common coding methods for transmitting data in optical communications systems.

In URZ coding, the signal level during the first half of a bit interval is low for a "0" and high for a "1". During the second half of the bit interval, the signal level returns to zero for a "1" and remains at zero for a "0". In contrast, for UNRZ coding, the signal level is low for a "0" and high for a "1" during the full bit interval. And, as the name suggests, the signal level does not return to zero between successive "1"s. Both coding methods have well known advantages and disadvantages.

The main advantage of URZ is the presence of a discrete spectral component at the symbol rate, which allows simple timing recovery. Because of pulse transitions in URZ coding, it is considerably easier to recover clock information at the receiver end.

On the other hand, because of its relatively narrow pulses, more power and bandwidth are required for transmitting URZ-coded signals. In fact, URZ coding requires twice the bandwidth that UNRZ does. URZ coding consumes more power per bit than UNRZ does during transmission because of the half-bit-pulse waveform of URZ and its higher DC power content. And, if the coding requires more bandwidth, then noise power increases. As a result, URZ coding degrades signal-to-noise ratio (SNR) at the receiver end as the noise bandwidth is doubled.

For the case of UNRZ coding, a particularly important advantage, relative to URZ, is that of a relatively low bandwidth requirement. UNRZ coding also has a superior signal-to-noise ratio (SNR) to URZ.

However, UNRZ coding has its disadvantages as well. Clock recovery is more complicated with UNRZ coding as there are no clock frequency components in the signal spectrum. With UNRZ coding, for example, a loss of synchronization and timing jitter can result from the transmission of a long sequence of "1"s because, unlike URZ coding, no pulse transition is present. Particularly for AC-coupled systems, UNRZ leads to significant baseline wander for waveforms representing long strings of "1"s, while URZ has minimal baseline wander. Both URZ and UNRZ coding are susceptible to baseline wander for long strings of "0"s. Thus, the communications system designer is inevitably faced with certain tradeoffs in making a choice between UNRZ and URZ coding.

Both UNRZ and URZ coding have particular application in optical communications systems because of their unipolar characteristics. Since laser power is either zero or a certain positive quantity, only unipolar encoding can be implemented in fiber-optical communication systems. UNRZ is ideal for laser modulation in optical communications and is the most popular coding method in fiber-optical communication systems. URZ is also used, particularly for ultra-high-speed pulse transmission and for soliton systems, because of its narrow pulses. URZ also significantly improves data transmission performance because it makes two pulse transitions during a bit interval, whereas UNRZ-coding signals suffers loss of timing or signal-level drift during a long string of 0 or 1 bits. However, the tradeoff for choosing UNRZ coding over URZ is that URZ requires more system bandwidth.

There is therefore a need in the art of communications transmission systems, both electrical and optical, for a coding method that uses signal power as efficiently as possible, while preserving capability for clock recovery. A coding method that does not demand more system and channel bandwidth is needed, since bandwidth is expensive and increases noise power. Furthermore, a coding format is needed to avoid baseline wander so that costly restoration techniques, such as decision feedback or scrambling/descrambling mechanisms, are no longer needed. A coding method that optimally eliminates the dispersion effect of inter-symbol interference (ISI) is needed without requiring higher data rates for sampling. In short, a new coding format is needed in the art that combines the advantages of URZ and UNRZ coding, while at the same time avoiding some of the disadvantages thereof.

SUMMARY OF THE INVENTION

The invention is a unique method of generating UNRZ data from URZ data that combines the advantages of both coding methods while largely avoiding the disadvantages thereof. The coding in the invention transmits URZ data at the transmitter, along with a delayed copy thereof and receives UNRZ data by combining the two URZ pulse streams at the receiver. The invention optimally eliminates ISI due to dispersion occurring with the use of UNRZ coding alone in data communication systems. The invention also reduces bandwidth (noise) penalty incurred by transmitting and receiving URZ pulses. In addition, the invention largely avoids baseline wander so that costly (both in monetary and data rate terms) restoration techniques, such as decision feedback or scrambling/descrambling mechanisms, are no longer needed. The net bandwidth requirement of a communications system implemented according to the method of the invention, with URZ and $URZ_d$ data transmitted via a transmission medium and converted to UNRZ coding at a receiver location, is the same as that of a system that transmits and receives UNRZ data.

DETAILED DESCRIPTION

The invention is directed to an improved method for coding data for transmission in a communications channel which results in increased transmission efficiencies and improved signal quality. Application of the methodology of the invention is described hereafter in terms of a preferred embodiment based on URZ and UNRZ coding of data to be transmitted in an optical communications system. It will, however, be apparent to those skilled in the art that the inventive methodology may be applied for a variety of other coding or modulation techniques applied in electrical and optical communication systems.

In the preferred embodiment, the invention provides essentially a hybrid coding methodology which combines features of UNRZ coding and URZ coding, and thereby achieves many of the advantages of both, while largely avoiding the disadvantages associated with those coding methodologies. A central facet of the new coding methodology lies in the inventor's recognition that a UNRZ coded signal for a given data stream is equivalent to a sum of two URZ coded signals for that data stream where the second of those URZ coded signals is delayed relative to the first URZ coded signal by one-half of a bit interval. Based on this relationship, the method of the invention operates to cause a URZ coded signal to be generated for the data to be transmitted, along with a replication of that URZ coded signal, with each coded bit optimally delayed by one-half of a bit interval, i.e., by a phase difference of 90 degrees. Both the original and the delayed URZ signals are then transmitted to a receiver where the two coded signals are added to produce a UNRZ coded signal for the transmitted data.

The methodology of the invention is particularly advantageous in optical transmission systems, in that URZ coded data have properties that favor optical transmission and it is therefore desirable to be able to transmit URZ data instead of UNRZ data and still be able to realize the benefits of receiving UNRZ data. Note also that the net bandwidth requirement of a communications system implemented according to the method of the invention, with URZ and $URZ_d$ data transmitted via a transmission medium and converted to UNRZ coding at a receiver location, is the same as that of a system that transmits and receives UNRZ data.

Figure 1A:
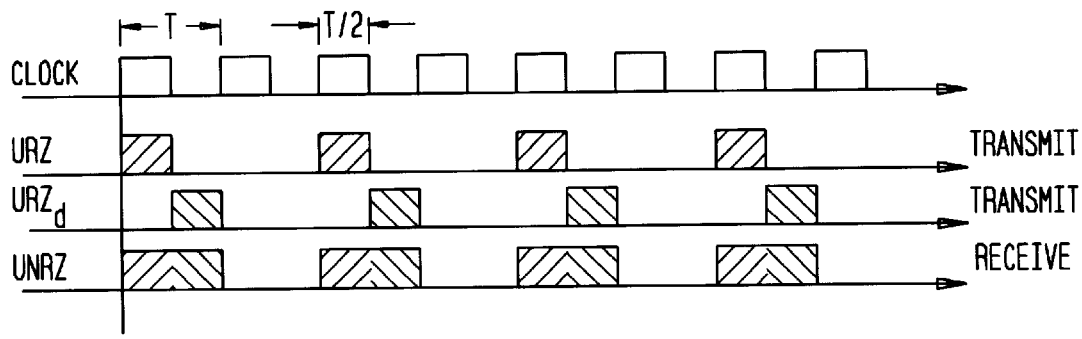
FIGS. 1A, 1B, 1C and 1D illustrate, using timing diagrams, the generation of UNRZ data from URZ data according to the method of the invention.

The generation of UNRZ data from URZ data according to the method of the invention is illustrated in FIG. 1A using timing diagrams for the system clock and for the various encoded signals encompassed by the methodology. The clock as shown has a bit period of T. Data is coded with a bit rate of 1/T. Illustratively, the input data stream to be coded is "10101010," with each "1" or "0" being coded according to the format of the illustrated coding method. Coding of the data using the URZ format is shown as "URZ" in the figure. Note that a "1" in a bit of the data as represented in URZ code has a pulse width T/2, which is half of that of the data in UNRZ code. Then, each coded URZ bit is delayed by T/2 to derive a replication of that URZ coding with a delay of one-half the clock interval, as shown as "$URZ_d$" in the figure. URZ is then summed with $URZ_d$ to derive a data encoding as shown as "UNRZ" in the figure. As can readily be seen the new data encoding of UNRZ is the equivalent of UNRZ coding of the original data of "10101010."

Figure 1B:
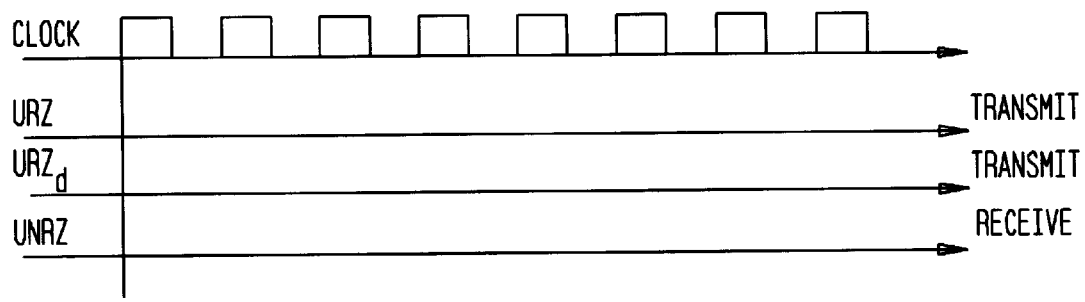
Figure 1C:
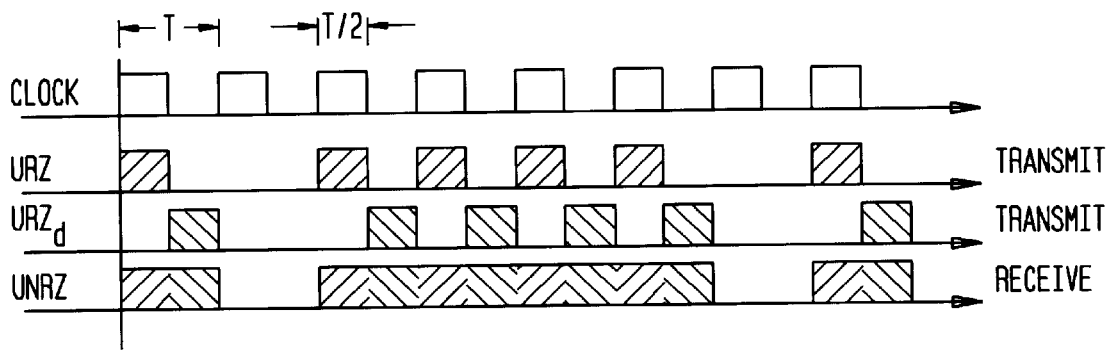
Figure 1D:
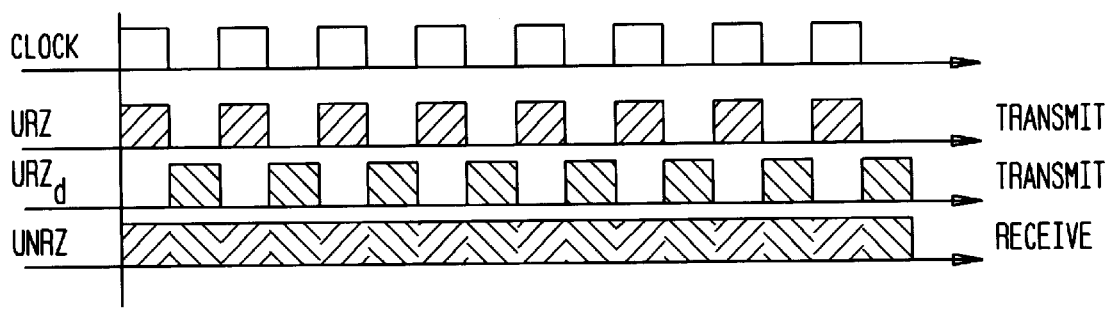

Similarly, FIG. 1B illustrates the operation of the method of the invention where a bit sequence of all "0"s is transmitted in URZ and $URZ_d$ coding and received as UNRZ coded data for the all "0" bit sequence. FIG. 1C illustrates the operation of the method of the invention where a bit sequence of "10111101" is transmitted in URZ and $URZ_d$ coding and received as UNRZ coded data for the "10111101" bit sequence. FIG. 1D illustrates the operation of the method of the invention where a bit sequence of all "1"s is transmitted in URZ and $URZ_d$ coding and received as UNRZ coded data for the all "1" bit sequence.

One way to implement the inventive method is to first code the data in URZ at the transmitter and to also provide a replication of the URZ coded data delayed by one half the bit period. Next, both the URZ coded data and its delayed counterpart are transmitted to the receiver where they are summed to derive the UNRZ coding for the transmitted data. An optimal manner of implementing the invention is to transmit URZ data between the transmitter and the receiver because non-linearity effects are kept at a minimum (which reduces inter-symbol interference, (ISI)). Because of the sharper transitions and narrower pulses in URZ coding, interference between one pulse and the next (i.e., ISI) is kept at a minimum because the pulses are spaced further apart, as opposed to UNRZ coding. In addition, because URZ data are transmitted instead of UNRZ data, the effects of baseline wander associated with the transmission of UNRZ coded data are substantially reduced and restoration techniques such as decision feedback or scrambling/descrambling mechanisms are not needed.

Figure 2A:
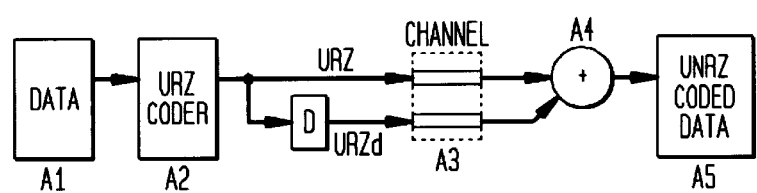
FIGS. 2A and 2B provide schematic illustrations of different embodiments of the invention.

FIG. 2A illustrates an embodiment of the invention that can be implemented in an electrical or optical data transmission system. Referring to the figure, the data source (A1) sends data to URZ Coder A2 where they are coded in URZ format. The URZ signal is then split into two signals, wherein the second of the two signals is delayed relative to the first signal (URZ) to obtain $URZ_d$. According to the method of the invention, the optimal delay (D) is one half of the bit interval. Both URZ and $URZ_d$ signals are then sent to a two-path transmission channel A3 for transmission to the receiver. Channel A3 can also be a multi-path transmission channel, or an optical channel with fiber-optic transmission paths. At the receiver, the URZ and $URZ_d$ signals are summed by adder A4 to obtain a UNRZ coded signal for the transmitted data.

A significant advantage of the invention is its flexibility of applying delay at either the transmitter, the receiver, or therebetween along the data channel. The individual delays can be set at, e.g., ¼, ⅛ of the full bit interval. Regardless of the length of individual delays, the method of the invention is optimally implemented so long as the total delay in the system of the two sets of URZ data is one half the bit interval.

This flexibility in applying the delay is particularly important in optical communications. For example, in fiber-optic communication systems, optical signals traveling in long fibers deteriorate after traveling for a long distance because the signals are delayed by the length of the fiber. As a result, the system designer is required to anticipate and rectify such signal deterioration by placing compensating filters with optical amplifiers at various points along the long fiber. The method of the invention advantageously eliminates the need for additional compensating filters and optical amplifiers by virtue of the flexibility of placing smaller, individual delays at any point along the fiber, or at the transmitter or the receiver. As a result of such flexibility, delay-induced signal deterioration is optimally addressed.

Figure 2B:
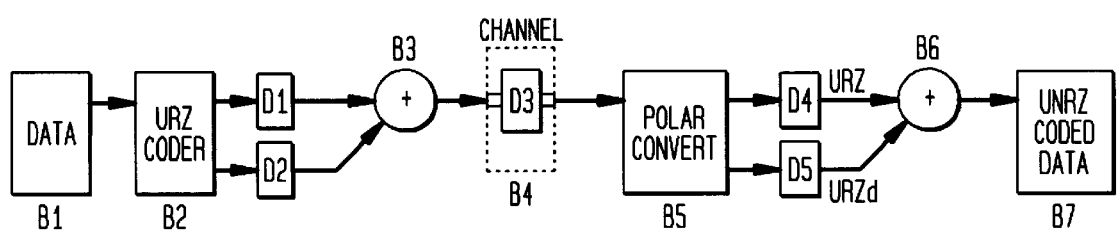

FIG. 2B illustrates another embodiment of the invention for implementation in an optical data transmission system. Referring to the figure, the data from data source B1 are coded in URZ format by URZ Coder B2. The URZ signal is then split into two signals, which are delayed by D1 and D2, respectively. The two delayed signals have different states of polarization. Note that regardless of the length of individual delays (D1 and D2) the method of the invention is optimally implemented so long as the total delay in the system between the two sets of URZ data is one half the bit interval.

The two delayed signals are low pass filtered by the LPF1 and LPF2 filters, respectively, to remove low level frequency components of such extraneous signal elements. The two filtered signals are then summed by Adder B3 to obtain a single combined signal for transmission through the single-path transmission channel B4. Even though the two delayed signals are combined into one signal, they still retain different states of polarization. Note that Channel B4 can also be a single-path fiber-optical channel.

Channel B4 has an inherent delay due to optical signal deterioration when the signal is traveling in a long fiber (as described hereinabove). The receiver then receives a single combined signal in URZ code which is split up into two signals by a polarization converter (Polar Convert B5). Polar Convert B5 splits the combined signal by distinguishing the different states of polarization of the two signals in the combined signal. The two signals are again delayed by D4 and D5, respectively, to obtain a URZ signal and its delayed counterpart, $URZ_d$. Even though the two signals have already been delayed and summed at the transmitter, they still may not be in sync for waveform superposition because of their respective states of polarization. The method of the invention advantageously calibrates another set of delay functions (D4 and D5) such that the two signals are delayed for optimal waveform superimposition to obtain equivalent UNRZ data.

The received URZ and $URZ_d$ data signal are low pass filtered by the LPF3 and LPF4 filters, respectively, to remove low level frequency components of such extraneous signal elements. After filtering, the two signals are then summed by Adder B6 to obtain UNRZ data at B7 that are equivalent to the original data at B1. Note that the delay values D1, D2, D4 and D5 are calibrated such that, in the final analysis, the net delay between URZ and $URZ_d$ before summing by Adder B6 is optimally set at one half of the bit interval.

Conclusion

The invention advantageously generates UNRZ data from URZ data. The method of the invention transmits URZ data and receives UNRZ data so that advantages of both URZ and UNRZ are utilized and drawbacks of both are largely avoided.

Changes and modifications in the specifically described embodiments can be carried out without departing from the scope of the invention, as defined in the claims hereof. Although preferred embodiments are disclosed herein, they do not limit the scope of the present invention.

I claim:

1. A method for transmitting data coded in a first coding format and receiving data coded in a second coding format, wherein a pulse interval for high-level pulses coded in the second coding format represents a multiple of a pulse interval for high-level pulses coded in the first coding format, the method comprising the steps of:

coding the data in the first coding format;

providing a replication of the data coded in the first coding format delayed by a time period;

transmitting the data coded in the first coding format and the replication across a propagation medium; and summing the data coded in first coding format and the replication to provide a coding of the transmitted data coded in the second coding format.

2. The method of claim 1 wherein the first coding format is unipolar return-to-zero.

3. The method of claim 1 wherein the second coding format is unipolar non-return-to-zero.

4. The method of claim 1, wherein the time period by which the replicated data coded in the first coding format is delayed is one half the multiple of a pulse interval.

5. A method for transmitting unipolar return-to-zero (URZ) coded data and receiving unipolar non-return-to-zero (UNRZ) coded data, comprising the steps of:
- coding the data in URZ format;
- providing a replication of the URZ coded data delayed by a time period;
- transmitting the data coded in URZ format and the replication across a propagation medium; and
- summing the data coded in URZ format and the replication to provide UNRZ coding of the transmitted data.

6. The method of claim 5, wherein the time period by which the replicated URZ coded data is delayed is one half the bit interval of the data.

7. The method of claim 5, wherein the propagation medium consists of the group of single-path data transmission channels, two-path data transmission channels and multi-path transmission channels.

8. The method of claim 5 being used in a system that consists of the group of wireless, optical, cable, semiconductor waveguide, and free space media communications systems.

9. A method for transmitting unipolar return-to-zero (URZ) coded data and receiving unipolar non-return-to-zero (UNRZ) coded data, comprising the steps of:
- coding a set of data to be transmitted in URZ format;
- providing a replication of the URZ coded data;
- causing the replicated URZ coded data to be delayed relative to the URZ coded data;
- summing the URZ coded data and the delayed replication to form a combined signal;
- transmitting the combined signal across a propagation medium;
- splitting the combined signal into two sets of URZ coded data;
- causing a second of the two sets of URZ coded data to be delayed relative to a first set of the two sets of URZ coded data; and
- summing the first set of the two sets of URZ coded data the second of the two sets of URZ coded data to provide UNRZ coding of the transmitted data.

10. An apparatus for transmitting unipolar return-to-zero (URZ) coded data and receiving unipolar non-return-to-zero (UNRZ) coded data, comprising:
- means for coding the data in URZ format;
- means for providing a replication of the URZ coded data delayed by a time period;
- means for transmitting the data coded in URZ format and the replication across a propagation medium; and
- means for summing the data coded in URZ format and the replication to provide UNRZ coding of the transmitted data.

11. The apparatus of claim 10, wherein the time period by which the replicated URZ coded data is delayed one half the bit interval of the data.

12. The apparatus of claim 10, wherein the propagation medium consists of the group of single-path data transmission channels, two-path data transmission channels and multi-path transmission channels.

13. The apparatus of claim 10 being used in a system that consists of the group of wireless, optical, cable, semiconductor waveguide, and free space media communications systems.

14. An apparatus for transmitting unipolar return-to-zero (URZ) coded data and receiving unipolar non-return-to-zero (UNRZ) coded data, comprising:
- means for coding a set of data to be transmitted in URZ format;
- means for providing a replication of the URZ coded data;
- means for causing the replicated URZ coded data to be delayed relative to the URZ coded data;
- means for summing the URZ coded data and the delayed replication to form a combined signal;
- means for transmitting the combined signal across a propagation medium;
- means for splitting the combined signal into two sets of URZ coded data;
- means for causing a second of the two sets of URZ coded data to be delayed relative to a first set of the two sets of URZ coded data; and
- means for summing the first set of the two sets of URZ coded data the second of the two sets of URZ coded data to provide UNRZ coding of the transmitted data.

* * * * *